(12) United States Patent
Felix

(10) Patent No.: US 8,723,571 B2
(45) Date of Patent: May 13, 2014

(54) DIGITAL FREQUENCY LOCKED LOOP

(75) Inventor: Steve Felix, Bristol (GB)

(73) Assignee: Nvidia Technology UK Limited (GB)

( * ) Notice: Subject to any disclaimer, the term of this patent is extended or adjusted under 35 U.S.C. 154(b) by 0 days.

(21) Appl. No.: 13/577,480

(22) PCT Filed: Feb. 22, 2011

(86) PCT No.: PCT/EP2011/052620
§ 371 (c)(1), (2), (4) Date: Aug. 7, 2012

(87) PCT Pub. No.: WO2011/104242
PCT Pub. Date: Sep. 1, 2011

(65) Prior Publication Data
US 2012/0313678 A1    Dec. 13, 2012

(30) Foreign Application Priority Data
Feb. 23, 2010    (GB) .................................. 1003030.2

(51) Int. Cl.
*H03L 7/06* (2006.01)
(52) U.S. Cl.
USPC .............. 327/159; 327/530; 375/373; 361/90

(58) Field of Classification Search
USPC .................. 327/156, 159, 530; 375/373–376; 331/1 A, 16, 1 R, 17; 361/90, 91.1, 92
See application file for complete search history.

(56) References Cited

U.S. PATENT DOCUMENTS

| 6,414,527 B1 | 7/2002 | Seno et al. | |
| 6,973,145 B1 * | 12/2005 | Smith et al. | 375/354 |
| 2007/0096781 A1 * | 5/2007 | Ito | 327/112 |

FOREIGN PATENT DOCUMENTS

WO    2011104242 A1    9/2011

* cited by examiner

*Primary Examiner* — Lincoln Donovan
*Assistant Examiner* — Thomas Skibinski (57) ABSTRACT

Integrated circuit and method for generating a clock signal, the integrated circuit comprising (i) a frequency locked loop comprising a voltage controlled oscillator configured to receive a control input and to generate a clock signal determined by the control input; and (ii) a microprocessor configured to be powered by a supply voltage and to receive the clock signal generated by the voltage controlled oscillator. The integrated circuit is configured to use the supply voltage as the control input, such that the clock signal is determined by the supply voltage.

19 Claims, 7 Drawing Sheets

DIGITAL FREQUENCY LOCKED LOOP

CROSS-REFERENCE TO RELATED APPLICATION

This application is the National Stage of, and therefore claims the benefit of, International Application No. PCT/EP2011/052620 filed on Feb. 22, 2011, entitled "Digital Frequency Locked Loop," which was published in English under International Publication Number WO 2011/104242 on Sep. 1, 2011, and has a priority date of Feb. 23, 2010, based on application GB application 1003030.2. Both of the above applications are commonly assigned with this National Stage application and are incorporated herein by reference in their entirety.

FIELD OF THE INVENTION

This invention relates to a digital frequency locked loop for generating a clock signal for a processor. The invention also relates to a method of generating a clock signal using a digital frequency locked loop.

BACKGROUND

In active power management (APM) schemes the short term control of processor clock frequencies and core supply voltage (Vdd) are managed to thereby minimise power consumption in an active mode. Active power management is generally a fast power management component, where clock frequencies and voltages may need to be modified every few hundred microseconds. Decisions are based on short term application needs.

Clock frequency is usually phase-locked to a crystal reference using a PLL and the generated clock period varies by only 1 or 2%.

Supply voltage must have sufficient margin to guarantee functionality in spite of dynamic fluctuations that depend on the supply circuitry's ability to respond to changes in load that in turn depend on the application software that the processor is running.

The aim of the invention is to remove or reduce the need for such margin—thus lowering power consumption.

SUMMARY

According to a first aspect of the present invention there is provided an integrated circuit comprising:

a frequency locked loop comprising a voltage controlled oscillator configured to receive a control input and to generate a clock signal determined by the control input; and a microprocessor configured to be powered by a supply voltage and to receive the clock signal generated by the voltage controlled oscillator, wherein the integrated circuit is configured to use the supply voltage as the control input, such that the clock signal is determined by the supply voltage.

According to a further aspect of the present invention there is provided a digital frequency locked loop for generating a clock signal, comprising:

a digital voltage controlled oscillator for receiving a first control value and for generating the output signal having a frequency $F_0$;

a control input line for inputting an adjustable second control value;

feedback control means for:

receiving the output signal from the digital voltage controlled oscillator, receiving the second control value from the control input line, generating a supply voltage in dependence upon the second control value and the output signal, and outputting the supply voltage to the digital voltage controlled oscillator, the digital voltage controlled oscillator being both powered and controlled by the supply voltage while the supply voltage is maintained within an acceptable range and wherein the frequency $F_0$ of the clock signal generated by the digital voltage controlled oscillator is dependent upon the supply voltage and the first control value, wherein the first control value is adjustable to adjust the frequency $F_0$ of the output signal whilst maintaining the supply voltage within the acceptable voltage range, whereby the frequency $F_0$ of the output signal is determined by the second control value.

According to another aspect of the present invention there is provided a method of generating an output signal using a digital frequency locked loop, the digital frequency locked loop comprising a digital voltage controlled oscillator and feedback control means, the method comprising:

receiving a first control value at the digital voltage controlled oscillator;

generating the output signal having a frequency $F_0$ at the digital voltage controlled oscillator;

receiving, at the feedback control means, the output signal from the digital voltage controlled oscillator;

receiving, at the feedback control means, an adjustable second control value;

generating, at the feedback control means, a supply voltage in dependence upon the second control value and the output signal; and outputting the supply voltage from the feedback control means to the digital voltage controlled oscillator, the digital voltage controlled oscillator being powered by the supply voltage while the supply voltage is maintained within an acceptable range and wherein the frequency $F_0$ of the output signal generated by the digital voltage controlled oscillator is dependent upon the supply voltage and the first control value, wherein the first control value is adjustable to adjust the frequency $F_0$ of the output signal whilst maintaining the supply voltage within the acceptable voltage range, whereby the frequency $F_0$ of the output signal is determined by the second control value.

The Digital Frequency Locked Loop (DFLL) allows the frequency $F_0$ of the clock output signal. to be adjusted and set to various frequencies. The DFLL uses the supply voltage as a feedback signal to set the frequency $F_0$ of the output signal. In order to achieve low frequencies for the output signal, the supply voltage would typically need to be reduced. However, reducing the supply voltage beyond an acceptable low voltage threshold limit can cause failures in the system (e.g. in SRAM memory writes and reads). The DFLL allows the supply voltage to be maintained within an acceptable voltage range whilst still allowing low frequencies to be generated for the output signal by varying the first control value (parameter N) which determines how the Digital Voltage Controlled Oscillator (DVCO) generates an oscillating signal from the supply voltage. In this way, the supply voltage is not reduced outside of the acceptable voltage range when low frequencies are generated for the output signal.

The Digital Frequency Locked Loop (DFLL) has the following advantageous properties:

for any given clock speed, a CPU using the clock frequency and supply voltage controlled by the DFLL can run at a significantly lower average voltage (as compared with a Phase Locked Loop (PLL)) because there is no need for a voltage margin to cover ripple and supply droop that results from load transients. In this way, the DFLL described herein improves the peak performance and power consumption of the CPU.

The Digital Voltage Controlled Oscillator (DVCO) is powered from and can be controlled by the core voltage supply (VDD). Thus the speed of the DVCO will track the speed of logic being clocked by the DFLL.

The DFLL is intended to be used instead of a PLL to generate processor clocks.

The feedback control means ensures that over relatively long periods (typically 10s of microseconds), the DFLL output signal having the clock frequency $F_0$ is an accurate multiple of the input clock, having the reference frequency $F_{ref}$ (every clock cycle is counted and the error is integrated continuously). The feedback control means includes a Pulse Width Modulated Digital to Analogue Converter (PWM DAC) and an external core Power Management Integrated Circuit (PMIC) (shown as External DC-DC converter in FIG. 1). The PWM DAC controls the PMIC. Both the PWM DAC and the PMIC form part of the feedback control means (or "control loop"). When the desired frequency $F_0$ of the output signal of the DFLL is too low to be reached by varying only the supply voltage (VDD), digital means of slowing down the DVCO are used (e.g. by adding extra stages and/or switchable loads to the DVCO) such that the frequency $F_0$ can be reduced without bringing the supply voltage (VDD) too low.

The DFLL described herein is not intended to generate clock signals for any timing critical external interface, such as a Universal Serial Bus (USB) interface or an external memory or bus interface. The logic clocked by the DFLL will interface to logic in other clock domains through fully asynchronous interface circuits with meta-stability resolvers. Many examples of such interfaces exist today and are well documented. For a meta-stability resolver circuit for which speed scales with supply voltage as well as logic, see GB Patent Application No. 0903687.2 describing a CMOS Metastability Resolving Latch.

BRIEF DESCRIPTION OF THE DRAWINGS

For a better understanding of the present invention and to show how the same may be put into effect, reference will now be made, by way of example, to the following drawings in which.

DETAILED DESCRIPTION OF PREFERRED EMBODIMENTS

A preferred embodiment will now be described by way of example with reference to FIG. 1 in which there is shown a Digital Frequency Locked Loop (DFLL) 100. The DFLL 100 comprises a Digital Voltage Controlled Oscillator (DVCO) 102, a first parameter input line 104, an output line 106, a first divider block 108, a reference input line 110, a reference divider block 112, a second divider block 114, first to seventh delay blocks 116, 118, 120, 122, 134, 138, 142 and 143, an AND gate 122, a second parameter input line 124, first to fifth multiplexers 126, 132, 136, 140 and 158, first to third adders 128, 154 and 156, first and second integrator blocks 130 and 160, first to fifth multipliers 144, 148, 150, 152 and 162, a programmable limiter 146, a Pulse Width Modulated Digital to Analogue Converter (PWM DAC) block 164, and an external DC-DC converter block 166. The external DC-DC converter block 166 comprises first to fifth resistors 168, 170, 174, 176 and 178, first and second capacitors 172 and 184, a Buck Converter Power Management Integrated Circuit (PMIC) block 180 and an inductor 182.

The first parameter input line 104 is coupled to a first input of the DVCO 102, for inputting a first digital parameter N to the DVCO 102. An output of the DVCO 102 is coupled to the output line 106. The output of the DVCO 102 is also coupled to an input of the first divider block 108. An output of the first divider block 108 is coupled to the clock inputs of the first to seventh delay blocks 116, 118, 120, 122, 134, 138, 142 and 143 and the first and second integrator blocks 130 and 160. The reference input line 110 is coupled to an input of the reference divider block 112. An output of the reference divider block 112 is coupled to an input of the second divider block 114. An output of the second divider block 114 is coupled to a data input of the first delay block 116. An output of the first delay block 116 is coupled to a data input of the second delay block 118. The purpose of (delay) blocks 116 and 118 is to resolve meta-stability that may occur due to sampling the divided reference clock. (flip-flops can be used for this purpose if correctly designed). An output of the second delay block 118 is coupled to a data input of the third delay block 120. The output of the second delay block 118 is also coupled to a first input of the AND gate 122. An output of the third delay block 120 is coupled to a second input of the AND gate 122 via an inverter. The output of the AND gate is synchronous with the divided DVCO clock and goes high each time the divided reference clock rises. An output of the AND gate 122 is coupled to a data input of the seventh delay block 143. The output of the AND gate 122 is also coupled to the clock inputs of the first to fourth multiplexers 126, 132, 136 and 140. An output of the seventh delay block 143 is coupled to the clock input of the fifth multiplexer 158. The second parameter input line 124 is coupled to the high data input of the first multiplexer 126 for supplying a value (M−1) to the first multiplexer 126. A signal with a value of −1 is coupled to the low data input of the first multiplexer 126. The output of the first multiplexer 126 is coupled to a first input of the first adder 128. An output of the first adder 128 is coupled to the high data input of the second multiplexer 132. The output of the first adder 128 is also coupled to the data input of the first integrator 130. An output of the first integrator 130 is coupled to a second input of the first adder 128. An output of the second multiplexer 132 is coupled to a data input of the fourth delay block 134. An output of the fourth delay block 134 is coupled to the low data input of the second multiplexer 132. The output of the fourth delay block 134 is also coupled to the high data input of the third multiplexer 136, and input of the first multiplier 144 and an input of the second multiplier 148. An output of the third multiplexer 136 is coupled to a data input of the fifth delay block 138. An output of the fifth delay block 138 is coupled to the low data input of the third multiplexer 136. The output of the fifth delay block 138 is also coupled to the high data input of the fourth multiplexer 140 and to an input of the third multiplier 150. An output of the fourth multiplexer 140 is coupled to an input of the sixth delay block 142. An output of the sixth delay block 142 is coupled to the low data input of the fourth multiplexer 140. The output of the sixth delay block 142 is also coupled to an input of the fourth multiplier 152. An output of the first multiplier 144 is coupled to an input of the limiter 146. An output of the limiter is coupled to a positive input of the second adder 154. Outputs of the second and fourth multipliers 148 and 152 are coupled to respective positive inputs of the second adder 154. An output of the third multiplier 150 is coupled to a negative input of the second adder 154. An output of the second adder 154 is coupled to a first input of the third adder 156. An output of the third adder 156 is coupled to a high data input of the fifth multiplexer 158. An output of the fifth multiplexer 158 is coupled to a data input of the second integrator 160. An output of the second integrator 160 is coupled to the low data input of the fifth multiplexer 158 and to a second input of the third adder 156. The output of the second integrator 160 is also coupled to an input of the fifth multiplier 162. An output of the fifth multiplier 162 is coupled to an input of the PWM DAC block 164. An output of the PWM DAC block 164 is coupled to an input of the first resistor 168. The output of the first resistor 168 is connected to the first capacitor 172 and to an input of the second resistor. Resistor 168 and capacitor 172 together have an RC time constant substantially greater than the PWM DAC's output signal period in order to filter the PWM DAC output. An output of the second resistor 170 is connected to respective inputs of the third and fourth resistors 174 and 176. An output of the fourth resistor 176 is coupled to an input of the fifth resistor 178 and to an input of the PMIC 180. The PMIC 180 has an input power supply (e.g. of 3.6V or 1.8V as shown in FIG. 1). An output of the PMIC 180 is coupled to an input of the inductor 182. An output of the inductor 182 is coupled to an output of the fifth resistor 178, to an input of the second capacitor 184 and coupled to supply the supply voltage (VDD) to a second input of the DVCO 104 and to all of the digital circuitry that uses the DVCO output as a clock signal.

Figure 1:
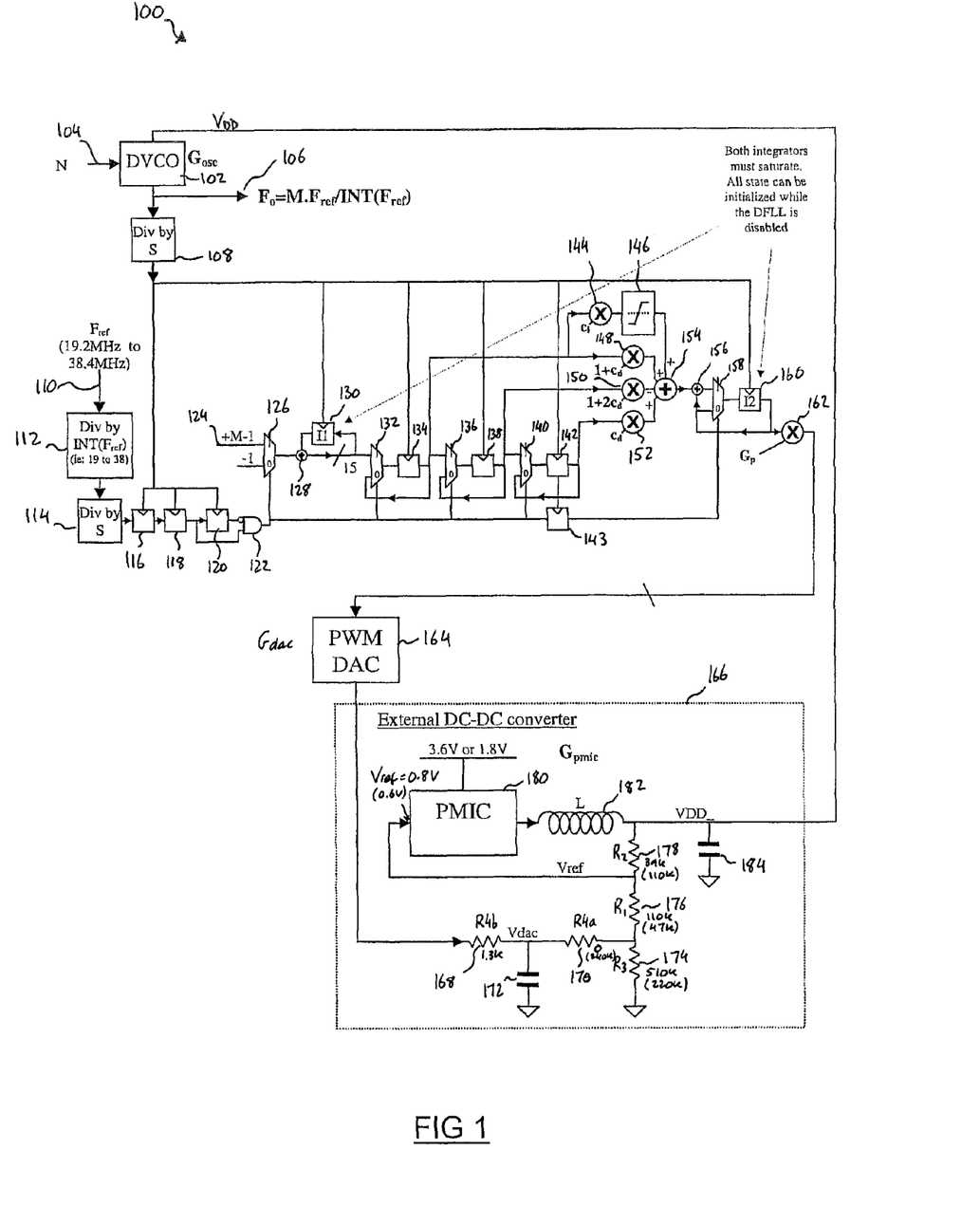
FIG. 1 is a circuit diagram of a DFLL according to a preferred embodiment.
Figure 2:
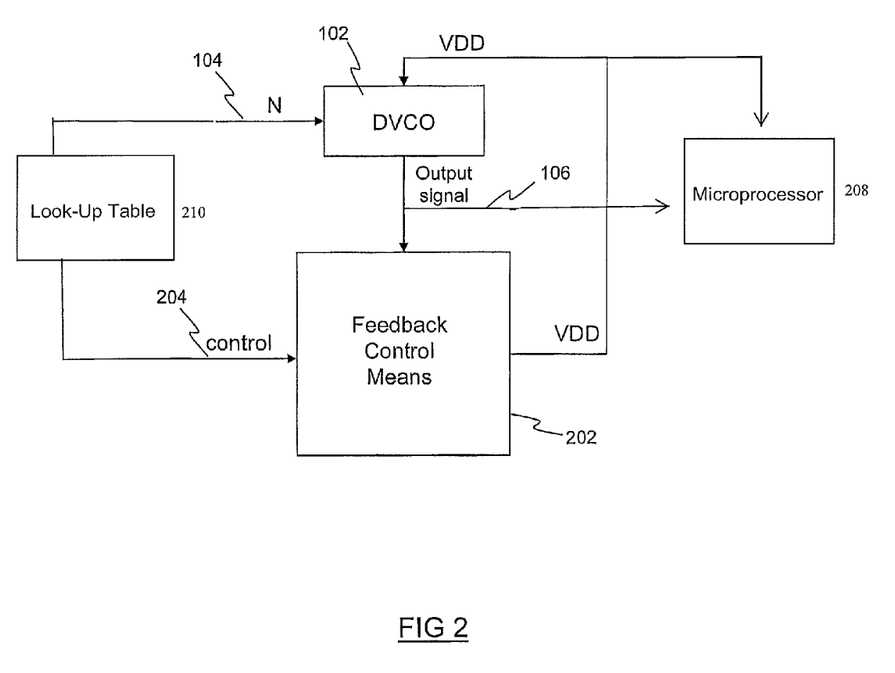
FIG. 2 is a simplified representation of the DFLL according to a preferred embodiment.

FIG. 2 shows a simplified representation of the DFLL 100 shown in FIG. 1. In FIG. 2 the circuitry shown in FIG. 1, except the DVCO 102, is shown as feedback control means 202. FIG. 2 shows the DVCO 102 receiving the first parameter N on first parameter input line 104 and outputting an output signal on line 106, the output signal also being coupled to the feedback control means 202. The feedback control means 202 receives a control signal on line 204. The control signal on line 204 comprises the reference signal on reference input line 110 and the second parameter M on the second parameter input line 124. The supply voltage (VDD) is output from the feedback control means 202 and input to the DVCO 102.

Figure 8:
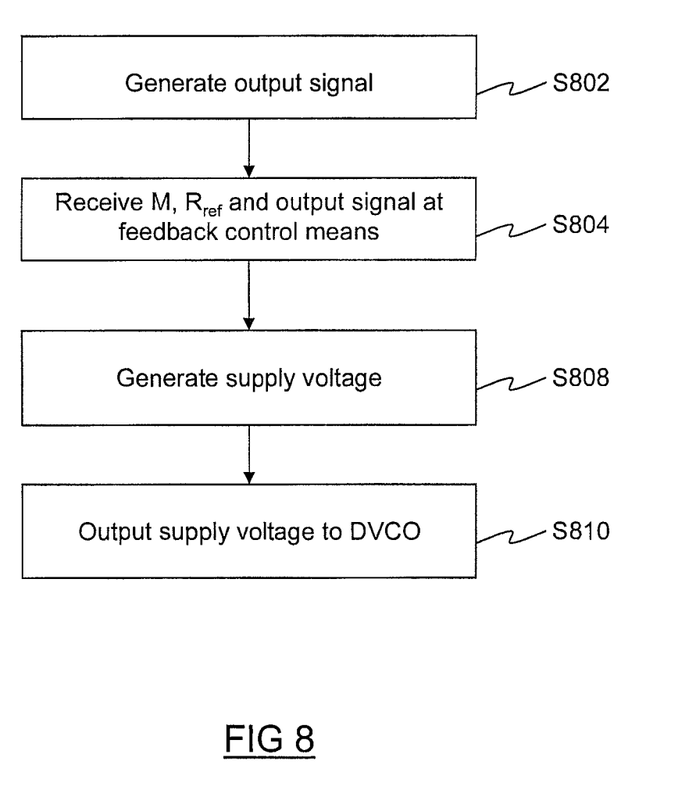
FIG. 8 is a flow chart for a process of generating an output signal using the DFLL according to a preferred embodiment.

The operation of the DFLL 100 will now be described in relation to the flow chart shown in FIG. 8. In operation, in step S802, the DVCO 102 generates an oscillating output signal. The frequency of the output signal generated by the DVCO 102 depends upon the first parameter N and the supply voltage VDD received at the DVCO 102. The oscillating signal output from the DVCO 102 is output to the feedback control means 202. The details of the DVCO 102 are described further below. In essence the output of the DVCO 102 is an oscillating signal with a frequency $F_0$ that can be varied by varying the parameter (or "control value") N and the supply voltage. In the preferred embodiment shown in FIGS. 1 and 2, the supply voltage is controlled by the DFLL 100 to thereby control the frequency $F_0$ of the output signal on line 106.

In step S804 the second parameter M, the reference frequency signal (having frequency $F_{ref}$) and the output signal are received at the feedback control means 202. The more precise workings of the control means are described in more detail below, but there is now provided a higher level description of the DFLL 100 in relation to FIG. 2.

In step S806, the feedback control means 202 operates to generate the supply voltage. The supply voltage is then fed back to the DVCO 102 in step S808 to thereby control the frequency $F_0$ of the output signal. In this way the feedback control means creates a feedback loop such that the value of the output signal on line 106 affects the generation of the supply voltage (VDD) which thereby affects the generation of the output signal in the DVCO 102. The DFLL 100 will reach a steady state for the frequency $F_0$ of the output signal and the supply voltage (VDD). The control value on line 204, and more specifically the second parameter M determines the frequency $F_0$ that is reached in the steady state. As the second parameter M increases the supply voltage (VDD) is increased such that the output of the DVCO 102 has a higher frequency. The frequency $F_0$ of the output signal in the steady state is determined by the control value on the control value line 204, i.e. it is determined by the second parameter M and the reference frequency $F_{ref}$. Specifically, $$F_0 = M \frac{F_{ref}}{\text{int}(F_{ref})},$$

where $\text{int}(F_{ref})$ is $F_{ref}$ rounded to the nearest integer. It can be appreciated that although the DVCO 102 generates the output signal having a frequency $F_0$ in dependence upon the first parameter N and the supply voltage, due to the feedback control means 202, which affects the supply voltage, the frequency $F_0$ of the output signal is determined by the second parameter M and the reference frequency $F_{ref}$ (i.e. by the control value on the control value line 204 in FIG. 2).

It is important to maintain the supply voltage (VDD) within an acceptable voltage range since the supply voltage can be used in the rest of the computing system in which the DFLL 100 operates, with the generated output signal having the frequency $F_0$ being used as a clock signal. If the supply voltage is below the acceptable voltage range then the processes to write to and read from memory may fail, or other functions within the computing system may fail. It is therefore important to maintain the supply voltage above a level at which operations in the computing system may fail. However, setting the supply voltage too high is wasteful of power.

Where the supply voltage is kept within the acceptable voltage range, the second parameter M can be varied in order to vary the frequency $F_O$ of the output signal (and thereby vary the supply voltage) without changing the parameter N. However, if a change to the parameter M, in order to achieve a particular frequency $F_O$ of the output signal, would result in the supply voltage changing to be outside of the acceptable voltage range at the current value of the first parameter N, then the value of the first parameter N is changed, such that the supply voltage is maintained within the acceptable voltage range after M is changed.

Figure 9:
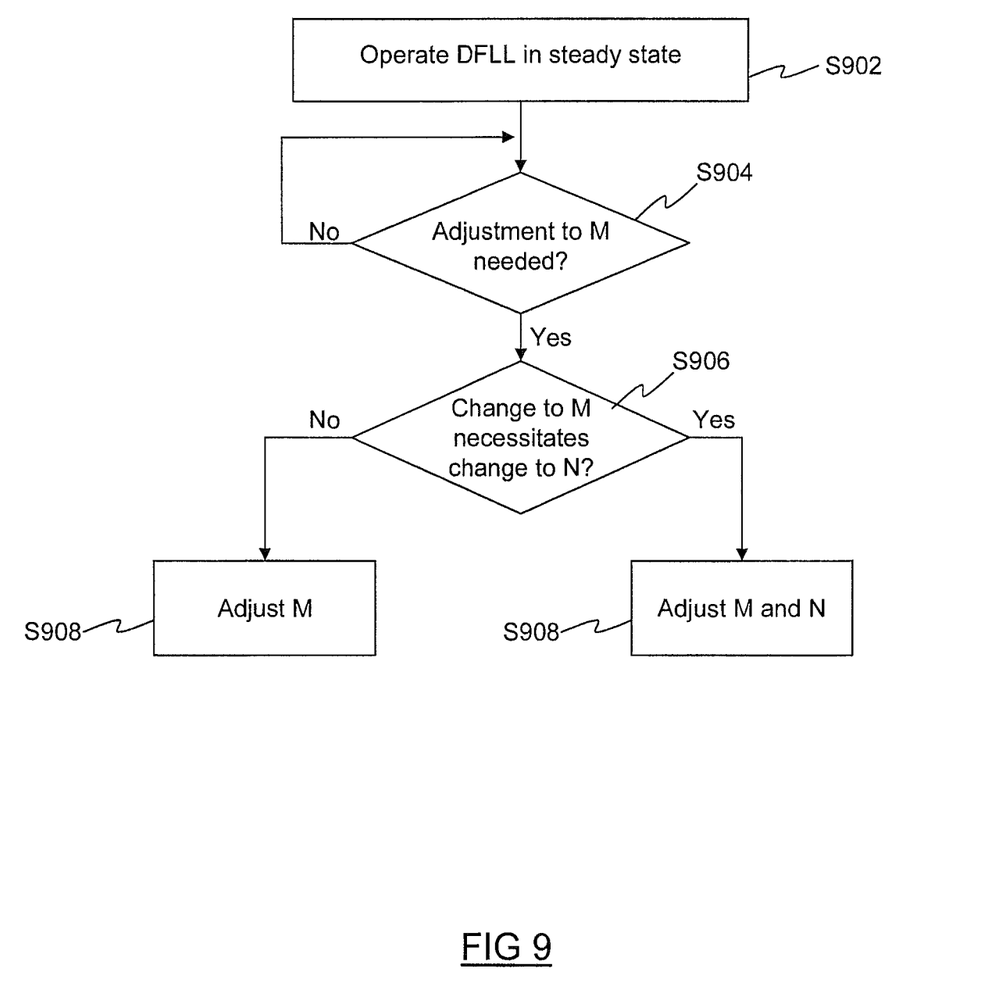
FIG. 9 is a flow chart for a process of adjusting M and N according to a preferred embodiment.

FIG. 9 shows a flow chart for a process of adjusting the frequency $F_O$ of the output signal. Initially in step S902 the DFLL 100 is operating in a steady state, generating the output signal at frequency $F_O$. In step S904 it is determined whether the frequency $F_O$ of the output signal needs to be adjusted. If the frequency $F_O$ of the output signal does not need to change then the second parameter M is kept constant and the DFLL 100 continues to operate in the steady state. When the DFLL 100 is operating in the steady state it may periodically check whether a change to the second parameter M is needed in step S904.

If in step S904 it is determined that the frequency $F_O$ does need to change, such that a change to the second parameter M is needed, the method passes to step S906 in which it is determined whether the change to M would take the supply voltage outside of the acceptable voltage range. If the change to M would take the supply voltage outside of the acceptable voltage range then a change to N is also required to maintain the supply voltage within the acceptable voltage range. If in step S906 it is determined that the change to the second parameter M will not take the supply voltage outside of the acceptable voltage range then in step S908 the second parameter M is changed, such that the frequency $F_O$ of the output signal is adjusted accordingly.

If in step S906 it is determined that the change to the second parameter would take the supply voltage outside of the acceptable voltage range then in step S910 both M and N are adjusted such that the frequency $F_O$ of the output signal is adjusted accordingly and the supply voltage is maintained within the acceptable voltage range.

When both the first and second parameters M and N are changed, it is important to change the parameters in the correct order to prevent the supply voltage momentarily dropping too low. When reducing the frequency $F_O$, the first parameter N should be adjusted first and then the second parameter M should be adjusted. Changes in the first parameter N should be implemented gradually (preferably no faster than 1 step per cycle of $F_O$—this can be achieved using a counter). The DVCO 102 is preferably designed so that the first parameter N can be adjusted in this way on-the-fly, i.e. in real-time.

When increasing the frequency $F_O$, the second parameter M should be adjusted first and then the first parameter N should be adjusted. The ordering ensures that the supply voltage is first increased and then decreased to settle in a new steady state (rather than being decreased and then increased), which is important to prevent the supply voltage (VDD) going too low.

It can therefore be seen that the DVCO 102 oscillator's digital cycle-time adjustment setting (i.e. the first parameter N) is a function of the speed setting, or second parameter, M. Adjustments to M may necessitate corresponding appropriate adjustments to N. Specifically, in preferred embodiments:

At high speed settings (having $F_O$ over ~500 MHz), the first parameter N is fixed at a (low) value such that all critical paths can just keep up with the DVCO 102.

At moderate speed settings (having $F_O$ ~400 to 500 MHz), (and therefore relatively low supply voltage) other critical path delays may dominate (for example SRAM tends to slow down more abruptly than logic as the supply voltage is reduced since speed becomes dominated by the high threshold voltages of the devices inside the SRAM cell that is most affected by random variation). Thus, it may be necessary to program a slightly higher value of N to slow down the DVCO 102 so that the slowest critical path in the SRAM can keep up in this moderate speed range.

At low speed settings (having $F_O$ at 200 to ~400 MHz), it is important to prevent the supply voltage (VDD) from being reduced to a level that would lead to hold failures or SRAM failure (writeability or read-upset failures). This is achieved by increasing the first parameter N (thereby slowing down the DVCO 102 digitally) at the same rate that the second parameter M is reduced.

The first parameter N can be determined from the second parameter M and a small number of other, fixed parameters that can be margined. A small lookup table 210 such as Table 1 shown below can be created since the first parameter N is quite coarsely quantized.

Very low speeds (having $F_O$ less than ~200 MHz and thus beyond the range of the DVCO at low supply voltage) can be achieved by dividing the frequency of the output signal by 2 or more while programming the FDLL 100 to stay in the 200 to 400 MHz range (such a divider is not illustrated in the Figures).

Referring now to the specific circuitry of the DFLL 100 shown in FIG. 1, the output signal is input into the first divider block 108 where it is divided by S (where S=int(T), i.e. the nearest integer value of T, where T is the analogue control delay of the feedback control means 202, measured in microseconds. Typically T is in the range 5 to 30. The reference frequency signal having a frequency $F_{ref}$ (in the range 19.2 MHz to 38.4 MHz) is input to the reference divider block 112 where it is divided by the nearest integer of the reference frequency $F_{ref}$. The output of the reference divider block 112 is divided by S in the second divider block 114 before being input to the first delay block 116. A signal of the second parameter M minus 1 is input to the high data input of the first multiplexer 126. The value of the second parameter is passed through the fourth to sixth delay blocks 134, 138 and 142 and through the second to fourth multiplexers 132, 136 and 140 and the signals are added in the second adder 154 as would be apparent to a skilled person. The value of the parameter $c_i$ used in the first multiplier 144 affects the speed at which the DFLL 100 can respond to changes in M to reach a steady state. A digital signal is output from the fifth multiplier 162 to the PWM DAC 164. The PWM DAC 164 converts the digital signal into an analogue signal with a voltage according to the pulse widths of the signal received from the fifth multiplier 162. Typically, the PWM DAC 164 applies a gain $G_{dac}$=56 mV/step. The PWM counter runs at approximately 384 MHz (32 steps at roughly 12 MHz output frequency). The analogue output signal from the PWM DAC 164 is used in the external DC-DC converter block 166 to generate the supply voltage (VDD).

The PMIC block 180 uses the following PMIC control equations to generate the supply voltage:

$$\frac{V_{dac}}{R4} = (V_{ref} - VDD)\frac{R1}{R2}\left(\frac{1}{R1} + \frac{1}{R3} + \frac{1}{R4}\right) + V_{ref}\left(\frac{1}{R3} + \frac{1}{R4}\right)$$

thus:

$$\frac{\partial(VDD)}{\partial(V_{dac})} \approx -0.33$$

(note that the gain is negative).

When the PWM DAC output is in high impedance mode (tri-stated)

$$VDD = V_{ref}\left(\frac{R2}{R1+R3}+1\right) = 0.85V$$

The loop transfer function of the DFLL 100 can be expressed as a 'Z' domain transfer function:

$$F_0 = \left(M\frac{F_{ref}}{\text{Int}(F_{ref})} - F_0\right)\frac{\text{Int}(F_{ref})}{F_{ref}}$$

$$\frac{Z^{\frac{t_d}{T}}Z^{-1}\left(c_d(1-Z^{-1})^2 + (1-Z^{-1}) + c_i\right)}{(1-Z^{-1})^2}G_pG_{dac}G_{pmic}G_{osc}$$

where the control loop sampling period $$t_s = \frac{\text{Int}(F_{ref})}{F_{ref}}\text{Int}(T) \approx T\mu s,$$

where ($Z = e^{st_s}$).

The time delay (lag) of the analogue circuitry between the PWM DAC output changing value and the supply voltage (VDD) changing is expressed as $t_d$.

Letting the overall loop gain be written as:

$$G = \frac{\text{Int}(F_{ref})}{F_{ref}}G_pG_{dac}G_{pmic}G_{osc},$$

we arrive at the following formula:

$$\frac{F_0}{F_{ref}} = \frac{Z^{\frac{t_d}{T}}Z^{-1}\left(c_d(1-Z^{-1})^2 + (1+Z^{-1}) + c_iGM\frac{\text{Int}(F_{ref})}{F_{ref}}\right)}{(1-Z^{-1})^2 + Z^{\frac{t_d}{T}}Z^{-1}(c_d(1-Z^{-1})^2 + (1-Z^{-1}) + c_i)G}$$

When the DFLL 100 reacts to a change in the second parameter M, the generated supply voltage takes time to respond and to settle in a steady state. When the second parameter M is increased the supply voltage is increased with a delay, and will overshoot the desired supply voltage before decreasing back to the desired voltage level. Similarly, when the second parameter M is decreased the supply voltage is decreased with a delay, and will undershoot the desired supply voltage before increasing back to the desired voltage level.

If $t_d/T$ is large then the amount of overshoot of the supply voltage increases (as does the likelihood of instability, i.e. not reaching a steady state). Setting $t_d/T \approx 1$ represents a good compromise between having a reasonably fast transient response and overshoot and instability. The RC time constant at the PWM DAC 164 output is 2 µs (in order to limit DAC output ripple). Furthermore, the PMIC 180 takes about 10 µs to respond. Based on this T can be set to 15 µs (allowing for several RC time constants plus a bit extra for the PMIC 180 to respond) as the control delay of the feedback control means 202. This leads to setting S=15 µs (S=Int(T)).

In preferred embodiments the loop gain is set to G=0.25 as a good compromise between transient response time and overshoot when $t_d/T=2$ d (due to external delay variation/uncertainty).

During transitions between different output frequencies $F_0$ (i.e. during the time between the DFLL 100 being in a steady state) the cycle count of the output signal either differs from the desired cycle count. When the frequency $F_0$ of the output signal is increased the cycle count is less than the desired cycle count (due to the finite response time of changing the frequency $F_0$ of the output signal), i.e. there is a cycle count deficit. When the frequency $F_0$ of the output signal is decreased the cycle count exceeds the desired cycle count (due to the finite response time of changing the frequency $F_0$ of the output signal), i.e. there is a cycle count surfeit.

The integral term $c_i$ and the differential term $c_d$ are both relative to the proportional term (implicitly equal to 1) since the overall loop gain can be set independently. The parameter integral term $c_i$ must be high enough to cancel promptly any accumulated cycle count surfeit or deficit. However, making $c_i$ too high leads to exaggerated overshoot of the supply voltage and the risk of instability. A value of $c_i$=0.25 is recommended. In order to avoid a lot of supply voltage overshoot, $c_d$ is chosen to be 0.5 and the limits of the integral term are set to $c_{ipos\ lim}$=400 as an upper limit and $c_{imeg\ lim}$=−100. The differential term $c_d$ helps to limit the overshoot of the supply voltage, but making $c_d$ too high leads to ringing due the over amplification of quantization noise. The two different limits for $c_i$ ensure that cycle count deficits are cleared rapidly when the clock speed is stepped up by allowing significant overshoot of the supply voltage. Conversely, when the clock speed is slowed down very little undershoot occurs (because of the relatively high limit of −100) but the cycle count surfeit takes longer to clear. This limit ($c_{ineg\ lim}$) could be set to zero to eliminate undershoot almost entirely.

As an example, to achieve $F_0$=1000 MHz, M is set to be 1000×Int(38.4)/38.4≈990. When a new frequency is selected, it will be reached within about 4T (60 µs).

If $G =$ $$\frac{\text{Int}(F_{ref})}{F_{ref}}G_pG_{dac}G_{pmic}G_{osc} \approx \frac{\text{Int}(F_{ref})}{F_{ref}}G_p \times -94.2 \text{ MHz/step} = 0.25$$

$$\text{Thus } G_p = 0.25 \times \frac{38.4}{38 \times -94.2} \approx -0.002682$$

Figure 10A:
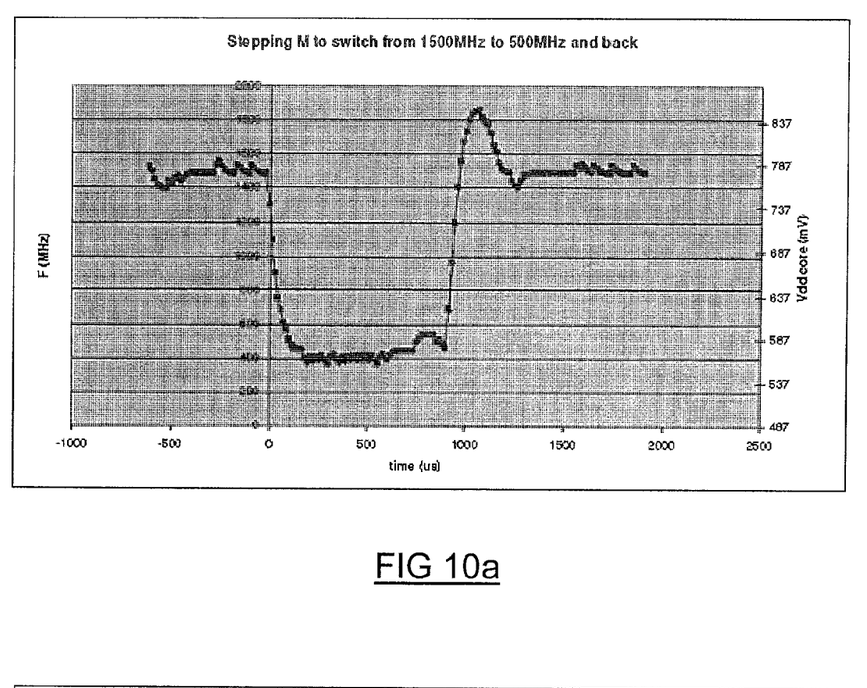
FIG. 10a is a graph showing the variation in frequency and supply voltage as M is switched from 1500 MHz to 500 Mhz and back.
Figure 10B:
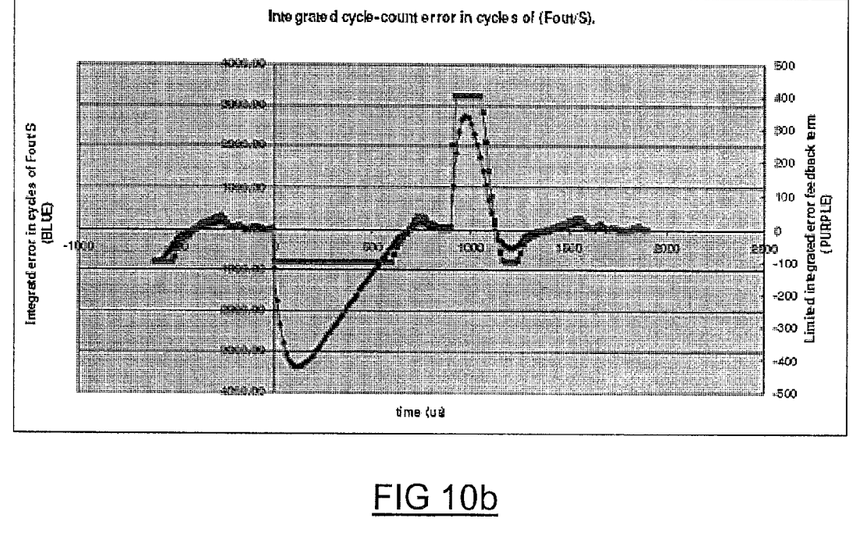
FIG. 10b is a graph showing the cycle count error as M is switched from 1500 MHz to 500 MHz.

FIGS. 10*a* and 10*b* show graphs of the frequency $F_0$ of the output signal and the integrated cycle count of the DFLL 100 when the second parameter M is switched from 1500 MHz to 500 MHz and back. The data shown in the graphs of FIGS. 10*a* and 10*b* was produced from a discrete model of the filter described above. The analogue components of the DFLL 100 were modelled as having a fixed gains and an aggregate time delay of 15 µs (one sampling period).

It can be seen in FIG. 10*a* that when the second parameter M is switched down to 500 MHz, the frequency $F_0$ (and therefore the supply voltage) undershoots and reaches approximately 400 MHz, and takes a long time to raise back up to 500 MHz. Furthermore in FIG. 10*b* it can be seen that it takes time to clear the cycle count surfeit since $c_i$ only drops down to −100.

However, when the second parameter M is switched up to 1500 MHz, the frequency $F_0$ (and therefore the supply voltage) overshoots and reaches approximately 1850 MHz, but does not take a long time to fall back down to 1500 MHz. Furthermore in FIG. 10b it can be seen that the cycle count deficit does not take a long time to clear since $c_i$ rises to 400. It is clear that undershoot is very limited ($C_{ineglim}=-100$) at the expense of taking longer to clear a cycle-count surfeit. On the other hand significant overshoot is allowed ($C_{iposlim}=400$) to expedite clearing a cycle-count deficit. It should be pointed out here that a cycle deficit can cause a real-time application running on a microprocessor 208 to fail while the only disadvantage of a prolonged cycle surfeit is wasted energy/power.

The dithering that can be seen in FIGS. 10a and 10b after settling (i.e. after reaching a steady state) is due mainly to the PWM DAC 164 step size.

The acceptable voltage range (i.e. the min and max VDD acceptable) for the supply voltage can be set in at least the following two ways:
1) The choice of the first to fifth resistors 168, 170, 174, 176 and 178 in the external DC-DC converter block 166 limits min and max VDD to just under 0.5V and just over 1V respectively.
2) Hard limits can be placed on the second parameter M to limit the speed requested (and thus max Vdd). Also, the relationship between M and N is used to limit min Vdd.

The lower limit of the integral term $C_{ineglim}$ must also be set so as to prevent excessive undershoot of the supply voltage when stepping down in speed. Similarly, reducing $C_{iposlim}$ limits overshoot of the supply voltage but can increase the time required to clear a cycle count deficit when speed is increased (and in any case the option 1) described above should be sufficient to limit max VDD).

When the DFLL 100 is started up the following sequences of events occurs:
1) On POR,
   The PMW DAC 164 output is High and thus, the resistors in the external DC-DC converter block 166 set the supply voltage (VDD) to a nominal value (0.85V±5%).
   The DFLL 100 is bypassed (the clock is derived directly from $F_{ref}$).
   The DVCO 102 is disabled.
   The DFLL delay blocks are all reset to '0'.
2) During boot the parameters $G_p$, S, INT($F_{ref}$), M and N are written to control registers in the FDLL 100. A frequency of about 1 GHz should be selected.
3) The second Integrator 160 is initialized with a value designed to set the PWM DAC 164 output to produce an output voltage that will cause the supply voltage to be set to roughly a nominal value (e.g. 0.85V). For a 32-step PWM DAC 164, this will be approximately 10 (=32*(1.0V−0.85V)/(1.0V−0.5V)). Thus the second integrator 160 should be initialized to about 10/$G_p$. This step prevents the supply voltage (VDD) from changing significantly when the DAC is turned on.
4) The PWM DAC 164 output is enabled. A 15 μs delay should be inserted here to allow the supply voltage (VDD) to settle to a slightly different value.
5) Finally, the FDLL 100 is enabled.

The FDLL 100 will then adjust the supply voltage (VDD) so that on average: $F_0=M \cdot F_{ref}/INT(F_{ref})$. The second parameter M can be adjusted in real-time (on-the-fly), although at low speeds the first parameter N may also need adjustment, as described previously. Table 1 is given later by way of example.

We now present some specific details of the DVCO 102.

Figure 3:
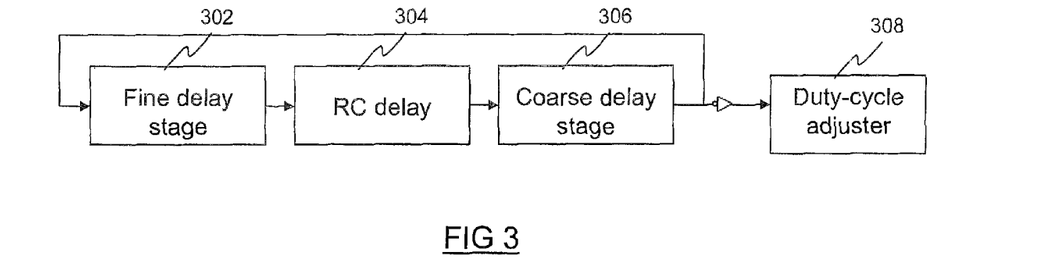
FIG. 3 is a representation of a DVCO according to a preferred embodiment.

FIG. 3 is a representation of the DVCO 102 in a preferred embodiment. The DVCO 100 is an oscillator built from a 3-part delay line with feedback. The DVCO comprises a fine delay stage 302, an RC delay block 304, a coarse ("trombone") delay stage 306 and a duty cycle adjuster block 308. The fine delay stage 302 and the coarse delay stage 306 have the supply voltage (VDD) as a power supply. An output of the fine delay stage 302 is coupled to an input of the RC delay block 304. An output of the RC delay block 304 is coupled to an input of the coarse delay stage 306. An output of the coarse delay stage 306 is coupled to an input of the duty cycle adjuster block 308. The output of the coarse delay stage 306 is also coupled to an input of the fine delay stage 302.

During manufacturing test, a setting will be determined for each individual part's fine delay line in order to maximize speed without CPU critical path failure. This setting may differ from part to part due to variations in global cross-die variation. Alternatively a single 'safe' setting could be chosen; but this would have to be margined to cover variation across all parts.

Figure 4:
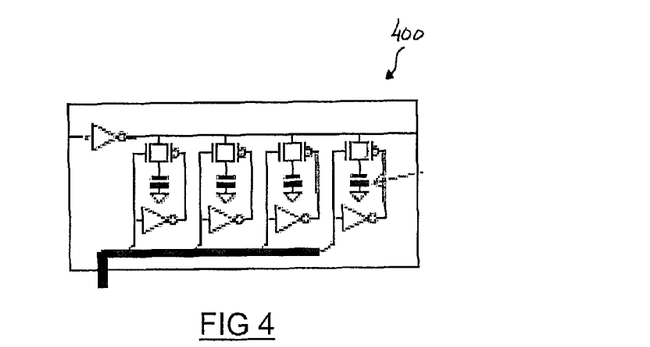
FIG. 4 is a circuit diagram of a fine delay line according to a preferred embodiment.

Adjustment of the fine delay stage setting alone should be sufficient to accommodate such variation (the coarse delay setting for high frequency operation being fixed and known for all parts). Thus, the fine delay stage needs a range of adjustability of about 4 gate delays (>10% of the cycle time). A resolution of <0.1 gate delays should be achievable by switching either loads or driver fingers in the stages of the fine delay line 302. The fine delay line 302 is likely to have a fixed delay equal to twice its range (8i). For example, the fine delay line 400 illustrated in FIG. 4 can have a delay between ~0.5 and ~0.75 gate delays in 8 steps. Sixteen of the elements shown in FIG. 4 could be combined to build the fine-delay stage 302 which would be adjustable between 8 and 12 gate delays in 65 steps. The 4-bit control inputs of the 16 elements must be interleaved to form a 64-bit thermometer control code. Thus, for example when the setting equals '32', every element has two switched loads enabled.

Figure 5:
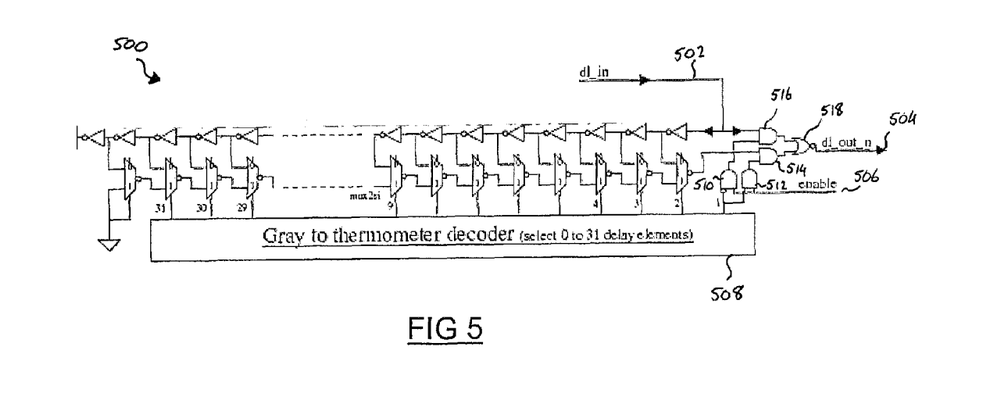
FIG. 5 is a circuit diagram of a coarse delay line according to a preferred embodiment.

An example of a coarse delay line 500 used in coarse delay stage 306 is shown in FIG. 5. The coarse delay line 500 comprises an input line 502, an output line 504, an enable line 506, a decoder block 508, first to fourth AND gates 510, 512, 514 and 516 and a NAND gate 518. The input line 502 is coupled to a first input of the fourth AND gate 516. The enable line 506 is coupled to respective first inputs of the first and second AND gates 510 and 512. A first output from the decoder block 508 is coupled to a second input of the first AND gate 510 via an inverter. The first output from the decoder block 508 is also coupled to a second input of the second AND gate 512. An output of the first AND gate 510 is coupled to a second input of the fourth AND gate 516. An output of the second AND gate 512 is coupled to a first input of the third AND gate 514. Outputs of the third and fourth AND gates 514 and 516 are coupled to respective inputs of the NAND gate 518. An output of the NAND gate 518 is coupled to the output line 504. A block of delay elements is also coupled to the input line 502 and to the decoder 508, with an output of the block of delay elements being coupled to the second input of the third AND gate 514.

The coarse delay line 500 is used to adjust the value of the second parameter N in the FDLL 100 in coarse steps of 2 gate delays. The coarse delay line 500 must have sufficient range to double (at least) the cycle time at fixed supply voltage (VDD). This allows a 2:1 speed adjustment range at min VDD. To achieve any lower speed, the output can be divided by a power of 2 and the DVCO speed increased by adjusting the parameters M and N in such a way that the device continues to run efficiently at (or very slightly above) min Vdd as described above.

Typically, if the worst case cycle time is 40 gate delays, then overall delay=20 gate delays. If the fine delay is typically 10 gate delays (8(fixed)+4(range/2)); then the coarse delay is 10 gate delays (5 stages). An additional 10 coarse delay stages (~20 gate delays) are sufficient to double the cycle time. Thus 15 coarse delay stages appear to be enough. However, since a few more stages might need to be invoked at low-speed and low supply voltage (VDD) to allow (effectively extra Vdd margin) for the SRAM and since the coarse delay stages might not be exactly 2 gate delays, it is recommended to implement 32 coarse delay stages.

The RC delay block 304 is there to introduce some power supply invariant delay. This prevents the DVCO 102 from speeding up more than an RC dominated critical path when the supply voltage overshoots. Up to 50 μs of RC delay can be selected in 4 steps, comprising up to 100 μs of the total cycle-time. For example, at 1.85 GHz this represents approximately 0, 6%, 12% or 18% of the cycle time.

Figure 6:
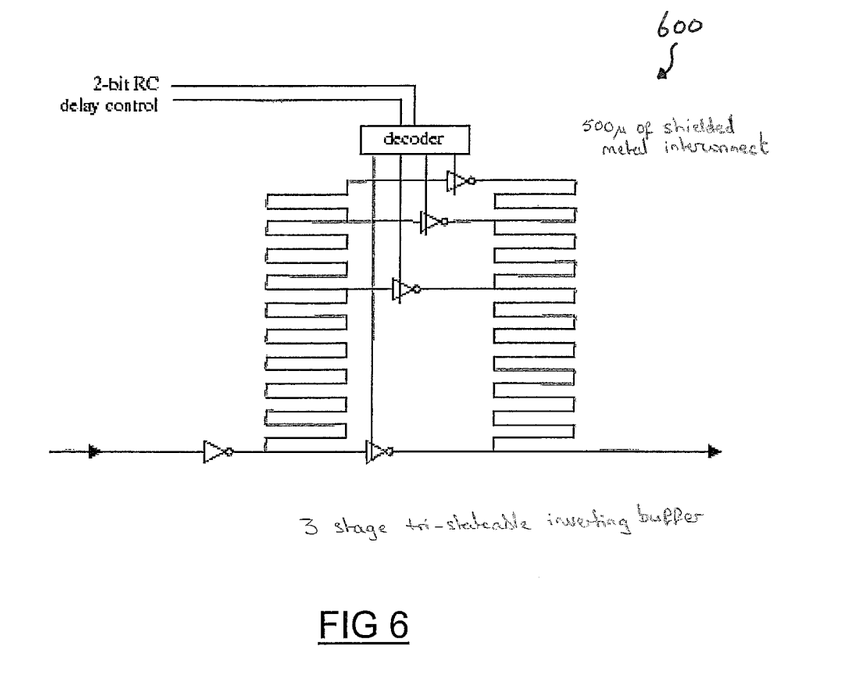
FIG. 6 is a circuit diagram of an RC delay line according to a preferred embodiment.

An example RC delay block 600 is shown in FIG. 6. The RC delay block is designed to provide reasonably good matching between rising and falling edge delays. Up to a point, it also tracks real process variation in interconnect RC delay since metal traces are used to provide the actual RC delay (just as metal traces introduce RC delay to critical paths in the processor 208 or logic being clocked).

How much RC delay is needed will depend on how RC dominated the most critical CPU path is at high supply voltage (VDD).

Figure 7:
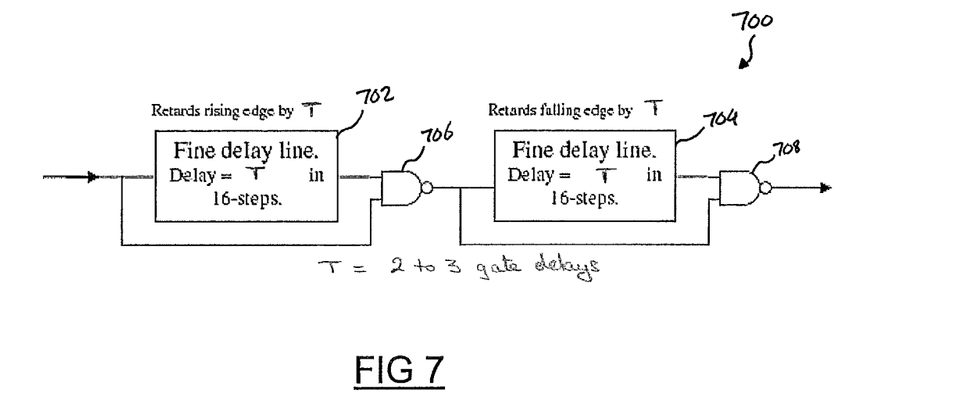
FIG. 7 is a diagram of a duty cycle adjuster according to a preferred embodiment.

Finally, an example duty cycle adjuster 700 is illustrated in FIG. 7. The duty cycle adjuster 700 comprises a first fine delay line 702, a second fine delay line 704, and first and second NAND gates 706 and 708. The first delay line 702 receives an input to the duty cycle adjuster 700. The input is coupled to a first input of the first NAND gate 706. An output of the first fine delay line 702 is coupled to a second input of the first NAND gate 706. An output of the first NAND gate 706 is coupled to an input of the second fine delay line 704. The output of the first NAND gate 706 is also coupled to a first input of the second NAND gate 708. An output of the second fine delay line 704 is coupled to a second input of the second NAND gate 708. An output of the second NAND gate 708 is output from the duty cycle adjuster 700.

Duty cycle adjustments are potentially of benefit to some circuits in a processor where critical paths from rising to falling clock edges may exist. For zero duty cycle adjustment, both delays are set to the middle of their range (~2.5i).

We present here, in Table 1, some typical values for the parameters M and N when various speeds are selected:

38.4 Fref
1800 Fmax
600 Fcrosssram Must adjust N below this frequency to allow for SRAM slowdown
400 Fvddfloor Must adjust N to preserve Vdd min below this frequency
36 I (cycle time)
5.1 MHz/mV at high speed settings
2 I (delay per coarse delay adjustment stage)
487 mV osc/logic Fo=0 (extrapolated assuming that speed changes linearly with Vdd)
520 mV SRAM Fo=0 (extrapolated assuming that speed changes linearly with vdd)
Calculated Values:
200 Fmin=Fvddfloor/2 Use a clock Milder to go below this frequency,
14 I (fine delay plus RC delay setting)
2 N typ (high speed setting for N)
4 N setting at Fvddfloor to allow for SRAM
7.1 MHz/mV SRAM speed/mV at low Vdd

TABLE 1 typical values in the DFLL 100

| F wanted | F (MHz) | M | N | MHz/mV | Vdd mV | | Dynamic pwr (relative to 1 GHz) |
|---|---|---|---|---|---|---|---|
| 1800 | 1799.7 | 1781 | 2 | 5.10 | 840 | The DVCO tracks the | 272% |
| 1700 | 1699.7 | 1682 | 2 | 5.10 | 820 | critical path speed well | 245% |
| 1600 | 1599.7 | 1583 | 2 | 5.10 | 801 | enough without any | 220% |
| 1500 | 1499.6 | 1484 | 2 | 5.10 | 781 | adjustment at high | 196% |
| 1400 | 1399.6 | 1385 | 2 | 5.10 | 761 | speeds (N remains | 174% |
| 1300 | 1299.5 | 1286 | 2 | 5.10 | 742 | fixed). | 153% |
| 1200 | 1200.5 | 1188 | 2 | 5.10 | 722 | | 134% |
| 1100 | 1100.5 | 1089 | 2 | 5.10 | 703 | | 116% |
| 1000 | 1000.4 | 990 | 2 | 5.10 | 683 | | 100% |
| 900 | 900.4 | 891 | 2 | 5.10 | 664 | | 85% |
| 800 | 800.3 | 792 | 2 | 5.10 | 644 | | 71% |
| 700 | 700.3 | 693 | 2 | 5.10 | 624 | | 58% |
| 600 | 600.3 | 594 | 2 | 5.10 | 605 | | 47% |
| 575 | 575.0 | 569 | 3 | 4.59 | 612 | N is adjusted to slow | 46% |
| 550 | 549.7 | 544 | 3 | 4.59 | 607 | down the DVCO so that | 43% |
| 525 | 525.5 | 520 | 3 | 4.59 | 601 | the SRAM (or other | 41% |
| 500 | 500.2 | 495 | 3 | 4.59 | 596 | critical path(s) more | 38% |
| 475 | 474.9 | 470 | 3 | 4.59 | 590 | sensitive to low Vdd than | 35% |
| 450 | 449.7 | 445 | 3 | 4.59 | 585 | the DVCO) can keep up | 33% |
| 425 | 425.4 | 421 | 4 | 4.17 | 589 | with it. | 32% |
| 400 | 400.2 | 396 | 4 | 4.17 | 583 | | 29% |
| 375 | 374.9 | 371 | 5 | 3.83 | 585 | VDD is kept at (or just | 27% |
| 350 | 349.6 | 346 | 6 | 3.53 | 586 | above) the value | 26% |
| 325 | 325.4 | 322 | 7 | 3.28 | 586 | corresponding with | 24% |
| 300 | 300.1 | 297 | 8 | 3.06 | 585 | frequency Fvddfloor by | 22% |
| 275 | 274.9 | 272 | 10 | 2.70 | 589 | adjusting N. Stay in this | 20% |
| 250 | 249.6 | 247 | 11 | 2.55 | 585 | frequency range when | 18% |

TABLE 1-continued typical values in the DFLL 100

| F wanted | F (MHz) | M | N | MHz/mV | Vdd mV | | Dynamic pwr (relative to 1 GHz) |
|---|---|---|---|---|---|---|---|
| 225 | 225.3 | 223 | 13 | 2.30 | 585 | dividing the clock down | 17% |
| 200 | 200.1 | 198 | 15 | 2.09 | 583 | further to less than Fmin. | 15% |

It can be seen that by increasing the value of the first parameter N, the supply voltage is maintained above 580 mV, even when the second parameter M is reduced to reduce the frequency $F_0$ down to 200 MHz.

The PWM DAC and external PMIC illustrated in FIG. 1 could be replaced by an entirely integrated adjustable power supply. For example, an integrated buck converter, a linear regulator, a switched capacitor DC-DC converter or some combination of these could be used. The digital control loop described here requires only that there be a digitally controllable power regulator with an approximately linear, monotonic response.

While this invention has been particularly shown and described with reference to preferred embodiments, it will be understood to those skilled in the art that various changes in form and detail may be made without departing from the scope of the invention as defined by the appendant claims.

The invention claimed is:

1. An integrated circuit comprising:
a frequency locked loop comprising a voltage controlled oscillator configured to receive a control input and to generate a clock signal determined by the control input and configured to receive a digital control parameter; and
a microprocessor configured to be powered by a supply voltage and to receive the clock signal generated by the voltage controlled oscillator;
wherein the integrated circuit is configured to use the supply voltage as the control input, such that the clock signal is determined by the supply voltage, and wherein the frequency of the clock signal varies both with the supply voltage and the digital control parameter such that the digital control parameter determines the way in which the frequency of the clock signal varies with the supply voltage, and
wherein the digital control parameter is adjustable such that the frequency of the clock signal can be reduced whilst the supply voltage is maintained above an acceptable minimum voltage range so as to prevent a failure in the operation of the microprocessor.

2. The integrated circuit of claim 1 wherein the frequency locked loop further comprises feedback control means for receiving the clock signal generated by the voltage controlled oscillator and for adjusting the supply voltage in dependence upon the clock signal.

3. The integrated circuit of claim 2 wherein the feedback control means is configured to receive a feedback control value and configured to adjust the supply voltage in dependence upon the feedback control value.

4. The integrated circuit of claim 3 wherein the feedback control means is configured to adjust the supply voltage such that the frequency of the clock signal generated by the voltage controlled oscillator is determined by the feedback control value.

5. The integrated circuit of claim 3 wherein the feedback control value comprises a parameter M and a reference frequency signal having a frequency $F_{ref}$.

6. The integrated circuit of claim 3 wherein the feedback control means is configured to respond to changes in the feedback control value by adjusting the supply voltage to reach an adjusted steady level within a response time which is controllable by setting a second feedback control value.

7. The integrated circuit of claim 6 wherein the second feedback control value is set such that the response time is shorter for responding to a change in the feedback control value which results in the supply voltage increasing than the response time for responding to a change in the feedback control value which results in the supply voltage decreasing.

8. The integrated circuit of claim 6 wherein the second feedback control value is set such that the overshoot of the supply voltage caused by changing the feedback control value such that the supply voltage is increased is greater in magnitude than the undershoot of the supply voltage caused by changing the feedback control value such that the supply voltage is decreased.

9. The integrated circuit of claim 1 wherein the frequency locked loop is a digital frequency locked loop and the clock signal is a digital clock signal.

10. The integrated circuit of claim 1 wherein the feedback control means comprises a digital to analogue converter for generating an analogue signal.

11. The integrated circuit of claim 10 wherein the feedback control means further comprises a power management block for receiving the analogue signal and for adjusting the supply voltage in dependence upon the analogue signal.

12. The integrated circuit of claim 3 wherein the digital control parameter is configured to be set based on the value of the feedback control value.

13. The integrated circuit of claim 12 wherein the digital control parameter is configured to be set based on the value of the feedback control value using a look up table.

14. The integrated circuit of claim 1 configured such that if both the feedback control value and the digital control parameter are to be adjusted to cause an increase in the supply voltage then the feedback control value is adjusted before the digital control parameter is adjusted.

15. The integrated circuit of claim 1 configured such that if both the feedback control value and the digital control parameter are to be adjusted to cause a decrease in the supply voltage then the digital control parameter is adjusted before the feedback control value is adjusted.

16. The integrated circuit of claim 1 wherein the voltage controlled oscillator is a digital voltage controlled oscillator comprising a fine delay stage controlled by the supply voltage and a coarse delay stage controlled by the supply voltage.

17. A method of generating a clock signal using an integrated circuit comprising a frequency locked loop and a microprocessor, the frequency locked loop comprising a voltage controlled oscillator, the method comprising:

receiving a control input and a digital control parameter at the voltage controlled oscillator;

generating, at the voltage controlled oscillator, a clock signal determined by the control input;

receiving, at the microprocessor, the clock signal generated by the voltage controlled oscillator; and powering the microprocessor with a supply voltage, wherein the supply voltage is used as the control input such that the clock signal is determined by the supply voltage and, wherein the frequency of the clock signal varies both with the supply voltage and the digital control parameter such that the digital control parameter determines the way in which the frequency of the clock signal varies with the supply voltage, and wherein the digital control parameter is adjustable such that the frequency of the clock signal can be reduced whilst the supply voltage is maintained above an acceptable minimum voltage so as to prevent a failure in the operation of the microprocessor.

18. A digital frequency locked loop for generating an output signal, comprising:

a digital voltage controlled oscillator for receiving a digital control parameter and for generating the output signal having a frequency $F_0$;

a control input line for inputting an adjustable control value;

feedback control means for:
receiving the output signal from the digital voltage controlled oscillator,
receiving the control value from the control input line,
generating a supply voltage in dependence upon the control value and the output signal, and
outputting the supply voltage to the digital voltage controlled oscillator, the digital voltage controlled oscillator being powered by the supply voltage while the supply voltage is maintained above an acceptable minimum voltage and wherein the $F_0$ of the output signal generated by the digital voltage controlled oscillator varies both with the supply voltage and the digital control parameter such that the digital control parameter determines the way in which the frequency $F_0$ of the output signal varies with the supply voltage, wherein the digital control parameter is adjustable to adjust the frequency $F_0$ of the output signal whilst maintaining the supply voltage above the acceptable minimum voltage, whereby the frequency $F_0$ of the output signal is determined by the control value.

19. A method of generating an output signal using a digital frequency locked loop, the digital frequency locked loop comprising a digital voltage controlled oscillator and feedback control means, the method comprising:

receiving a digital control parameter at the digital voltage controlled oscillator;

generating the output signal having a frequency $F_0$ at the digital voltage controlled oscillator;

receiving, at the feedback control means, the output signal from the digital voltage controlled oscillator;

receiving, at the feedback control means, an adjustable control value;

generating, at the feedback control means, a supply voltage in dependence upon the control value and the output signal; and outputting the supply voltage from the feedback control means to the digital voltage controlled oscillator, the digital voltage controlled oscillator being powered by the supply voltage while the supply voltage is maintained above an acceptable minimum voltage and wherein the frequency $F_0$ of the output signal generated by the digital voltage controlled oscillator varies with both the supply voltage and the digital control parameter such that the digital control parameter determines the way in which the frequency $F_0$ of the output signal varies with the supply voltage, wherein the digital control parameter is adjustable to adjust the frequency $F_0$ of the output signal whilst maintaining the supply voltage above the acceptable minimum voltage, whereby the frequency $F_0$ of the output signal is determined by the control value.

* * * * *